(12) United States Patent
Loseu et al.

(10) Patent No.: US 8,069,542 B1
(45) Date of Patent: Dec. 6, 2011

(54) INTERLEAVED INTERDIGITATED TRANSDUCERS

(75) Inventors: Aleh Loseu, Greensboro, NC (US); Jayanti Jaganatha Rao, Jamestown, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 533 days.

(21) Appl. No.: 12/030,711

(22) Filed: Feb. 13, 2008

Related U.S. Application Data

(62) Division of application No. 11/431,986, filed on May 11, 2006, now Pat. No. 7,449,813.

(60) Provisional application No. 60/684,015, filed on May 24, 2005, provisional application No. 60/687,822, filed on Jun. 6, 2005.

(51) Int. Cl.
*H04R 17/00* (2006.01)

(52) U.S. Cl. ............. 29/25.35; 29/594; 29/831; 29/846

(58) Field of Classification Search .................. 29/25.35, 29/594, 831, 846
See application file for complete search history.

(56) References Cited

U.S. PATENT DOCUMENTS

| | | | |
|---|---|---|---|
| 3,585,415 A | 6/1971 | Muller et al. | |
| 4,464,639 A | 8/1984 | Staples | |
| 5,010,269 A | 4/1991 | Hikita et al. | |
| 5,338,999 A | 8/1994 | Ramakrishnan et al. | |
| 5,446,330 A | 8/1995 | Eda et al. | |
| 5,448,126 A | 9/1995 | Eda et al. | |
| 5,453,652 A | 9/1995 | Eda et al. | |
| 5,682,126 A | 10/1997 | Plesski et al. | |
| 5,815,900 A | 10/1998 | Ichikawa et al. | |
| 5,846,320 A | 12/1998 | Matsuyama et al. | |
| 6,034,578 A | 3/2000 | Fujita et al. | |
| 6,313,568 B1 | 11/2001 | Sullivan et al. | |
| 6,353,372 B1 | 3/2002 | Baier et al. | |
| 6,420,820 B1 | 7/2002 | Larson, III | |
| 6,420,946 B1 | 7/2002 | Bauer et al. | |
| 6,441,539 B1 | 8/2002 | Kitamura et al. | |
| 6,573,635 B2 | 6/2003 | Suga et al. | |

(Continued)

FOREIGN PATENT DOCUMENTS

JP 02000932 A 1/1990

(Continued)

OTHER PUBLICATIONS

Sergei A. Doberstein et al., "Balanced Front-End Hybrid Saw Modules With Impedance Conversion," 2002 IEEE Ultrasonics Symposium, 2002, pp. 123-126, IEEE.

(Continued)

*Primary Examiner* — Derris Banks
*Assistant Examiner* — Azm Parvez
(74) *Attorney, Agent, or Firm* — Winthrow & Terranova, P.L.L.C.

(57) ABSTRACT

The present invention provides an interleaved IDT that is connected to and overlaps adjacent IDTs. In particular, the interleaved IDT may be connected to both an input IDT and an output IDT via corresponding bus bars. The first bus bar of the interleaved IDT is connected to the bus bar of the input IDT, and the other bus bar of the interleaved IDT is connected to a bus bar of the output IDT. The interleaved IDT is coupled electrically to the respective input and output ports of the overall surface acoustic wave architecture. As such, the bus bars of the respective input and output IDTs are effectively extended, such that the adjacent edges of the respective input and output IDTs partially overlap one another in an interdigitated fashion at the interleaved IDT.

10 Claims, 12 Drawing Sheets

U.S. PATENT DOCUMENTS

| | | |
|---|---|---|
| 6,599,781 B1 | 7/2003 | Li |
| 6,685,168 B1 | 2/2004 | Stelzl et al. |
| 6,737,941 B1 | 5/2004 | Tournois |
| 6,754,471 B1 | 6/2004 | Vakilian |
| 6,759,928 B2 | 7/2004 | Endou et al. |
| 6,801,100 B2 | 10/2004 | Nakamura et al. |
| 6,816,035 B2 | 11/2004 | Ma et al. |
| 6,853,113 B2 | 2/2005 | Bergmann |
| 6,861,927 B1 | 3/2005 | Abbott et al. |
| 7,019,435 B2 | 3/2006 | Nakaya et al. |
| 7,042,313 B2 | 5/2006 | Yata |
| 7,071,796 B2 | 7/2006 | Ueda et al. |
| 7,078,989 B2 | 7/2006 | Inoue et al. |
| 7,101,721 B2 | 9/2006 | Jorgenson et al. |
| 7,112,912 B2 * | 9/2006 | Inoue et al. ............... 310/313 B |
| 7,126,259 B2 | 10/2006 | Moler et al. |
| 7,304,553 B2 | 12/2007 | Bauer |
| 7,358,831 B2 | 4/2008 | Larson, III et al. |
| 7,528,684 B1 | 5/2009 | Rao et al. |
| 2004/0104791 A1 | 6/2004 | Satoh et al. |
| 2004/0164650 A1 | 8/2004 | Xu et al. |
| 2004/0256624 A1 | 12/2004 | Sung |
| 2005/0057323 A1 | 3/2005 | Kando |
| 2005/0099091 A1 | 5/2005 | Mishima et al. |
| 2006/0138902 A1 | 6/2006 | Kando |
| 2006/0186556 A1 | 8/2006 | Sung |
| 2007/0109075 A1 | 5/2007 | Igaki |
| 2007/0296306 A1 | 12/2007 | Hauser et al. |

FOREIGN PATENT DOCUMENTS

| | | | |
|---|---|---|---|
| JP | 7086866 A | 3/1995 | |
| JP | 2005347295 A | 12/2005 | |
| JP | 2006222512 A | 8/2006 | |
| WO | 2005069486 A1 | 7/2005 | |
| WO | 2005013481 A1 | 10/2005 | |
| WO | 2006032335 A1 | 3/2006 | |

OTHER PUBLICATIONS

Takao Norita et al., "Wideband Low Loss Double Mode SAW Filters," 1992 Ultrasonics Symposium, 1992, pp. 95-104, IEEE.

Hiroyuki Nakamura et al., "A Design Technique of Balanced Longitudinal Coupled Mode SAW Filters for RF-stage with a Desired Matching Impedance," 2003 IEEE Ultrasonics Symposium, 2003, pp. 2097-2100, IEEE.

International Search Report for PCT/US2008/050627 mailed May 30, 2008.

Kando, Hajime et al., "RF Filter Using Boundary Acoustic Wave," Japanese Journal of Applied Physics, 2006, 4651-4654, vol. 45, No. 5B, The Japan Society of Applied Physics.

Ruppel, C.C.W. et al., "Surface Acoustic Wave Devices for Wireless Area Networks," International Symposium on Acoustic Wave Devices for Future Mobile Communication Systems, Mar. 2001, EPCOS AG, Munich, Germany.

Yamaguchi, Masatsune et al., "Highly Piezoelectric Boundary Waves in Si/SiO2/LiNbO3 Structure," 1998 IEEE International Frequency Control Symposium, 1998, 484-488, IEEE.

Requirement for Restriction/Election mailed Dec. 8, 2010 regarding U.S. Appl. No. 12/030,666.

Requirement for Restriction/Election mailed Feb. 6, 2008 regarding U.S. Appl. No. 11/418,909.

Nonfinal Office Action mailed Apr. 3, 2008 regarding U.S. Appl. No. 11/418,909.

Final Office Action mailed Sep. 11, 2008 regarding U.S. Appl. No. 11/418,909.

Nonfinal Office Action mailed Feb. 5, 2009 regarding U.S. Appl. No. 11/418,909.

Notice of Allowance mailed Jul. 10, 2009 regarding U.S. Appl. No. 11/418,909.

Requirement for Restriction/Election mailed Sep. 9, 2008 regarding U.S. Appl. No. 11/969,956.

Requirement for Restriction/Election mailed Jan. 26, 2009 regarding U.S. Appl. No. 11/969,956.

Nonfinal Office Action mailed Jun. 1, 2009 regarding U.S. Appl. No. 11/969,956.

Final Office Action mailed Dec. 17, 2009 regarding U.S. Appl. No. 11/969,956.

Nonfinal Office Action mailed Aug. 5, 2010 regarding U.S. Appl. No. 11/969,956.

Final Office Action mailed Jan. 20, 2011 regarding U.S. Appl. No. 11/969,956.

Requirement for Restriction/Election mailed Dec. 7, 2007 regarding U.S. Appl. No. 11/623,939.

Notice of Allowance mailed Apr. 8, 2008 regarding U.S. Appl. No. 11/623,939.

Nonfinal Office Action mailed May 29, 2009 regarding U.S. Appl. No. 12/014,191.

Final Office Action mailed May 10, 2010 regarding U.S. Appl. No. 12/014,191.

Notice of Allowance mailed Jun. 7, 2010 regarding U.S. Appl. No. 12/014,191.

Ex parte Quayle Action mailed Mar. 16, 2011 regarding U.S. Appl. No. 12/030,666.

Sato, H. "Temperature Stable SAW Devices Using Directly Bonded LiTaO3/Glass Substrates," IEEE Ultrasonics Symposium, 1998, pp. 335-339, IEEE.

Mckeown, S.A., Mechanical Analysis of Electronic Packaging Systems, 1999, Marcel Dekker Inc., pp. 130-133.

ASM Handbook, vol. 21, Composites, 2001, pp. 1079, Table 1.

Non-Final Office Action mailed Oct. 4, 2011 from U.S. Appl. No. 12/031,885.

"US Data for Solids," retrieved from Signal Processing web site, www.signal-processing.com/tech/us_data_solid.htm, no date available, retrieved on Aug. 23, 2011.

* cited by examiner

INTERLEAVED INTERDIGITATED TRANSDUCERS

This application is a Divisional of U.S. utility application Ser. No. 11/431,986, filed May 11, 2006, now U.S. Pat. No. 7,449,813 which claims the benefit of U.S. provisional patent application Ser. No. 60/684,015, filed May 24, 2005 and provisional patent application Ser. No. 60/687,822 filed Jun. 6, 2005, the disclosures of which are incorporated herein by reference in their entireties.

CROSS-REFERENCE TO RELATED APPLICATIONS

This application is related to U.S. utility application Ser. Nos. 11/431,988 filed May 11, 2006, now U.S. Pat. No. 7,408,284; 11/432,249 filed May 11, 2006, now U.S. Pat. No. 7,528,684; and 11/431,991 filed May 11, 2006, now U.S. Pat. No. 7,521,837, the disclosures of which are incorporated herein by reference in their entireties.

FIELD OF THE INVENTION

The present invention relates to surface acoustic wave architectures, and in particular to a surface acoustic wave architecture employing interleaved interdigitated transducers.

BACKGROUND OF THE INVENTION

Surface acoustic wave (SAW) devices are often used in filtering applications for high-frequency signals. Of particular benefit is the ability to create low loss high order bandpass and notch filters without employing complex electrical filter circuits, which may require numerous active and passive components.

A common filtering application is in the transceiver circuitry of wireless communication devices. The maximum attainable SAW filter bandwidth and achievable minimum Insertion Loss are determined primarily by the piezoelectric properties of the substrate material and the metallization used for the transducers. At the same time choice of proper SAW filter structure is critical to meeting a specific filtering requirements specification. In mobile communications, there is always a need to minimize device insertion loss in order to increase battery life. Secondly, there is a need to decrease costs and minimize size. As such, there is a need for a more efficient technique to implement SAW filters with lower loss and wider bandwidths.

Although SAW filters with lower losses and wider bandwidths can be realized by choosing different materials, aspects like performance over operating temperature range and cost of implementation can be prohibitive.

As such, there is a further need to provide a SAW architecture that will allow wider filter bandwidths while minimizing losses to the signal being filtered irrespective of the substrate material being used. This will allow low cost implementation of improved filters as well as allow for application of current low cost materials with beneficial properties for newer applications.

SUMMARY OF THE INVENTION

The present invention provides an interleaved IDT that is connected to and overlaps adjacent IDTs. In particular, the interleaved IDT may be connected to both an input IDT and an output IDT via corresponding bus bars. The first bus bar of the interleaved IDT is connected to the bus bar of the input IDT, and the other bus bar of the interleaved IDT is connected to a bus bar of the output IDT. The interleaved IDT is coupled electrically to the respective input and output ports of the overall surface acoustic wave architecture. As such, the bus bars of the respective input and output IDTs are effectively extended, such that the adjacent edges of the respective input and output IDTs partially overlap one another in an interdigitated fashion at the interleaved IDT. Chirping may be employed within the interleaved IDT and at the edges of the input and output IDTs that are adjacent to the interleaved IDT. In one embodiment, the entire interleaved IDT is chirped with respect to the other IDTs and reflectors in the surface acoustic wave architecture.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
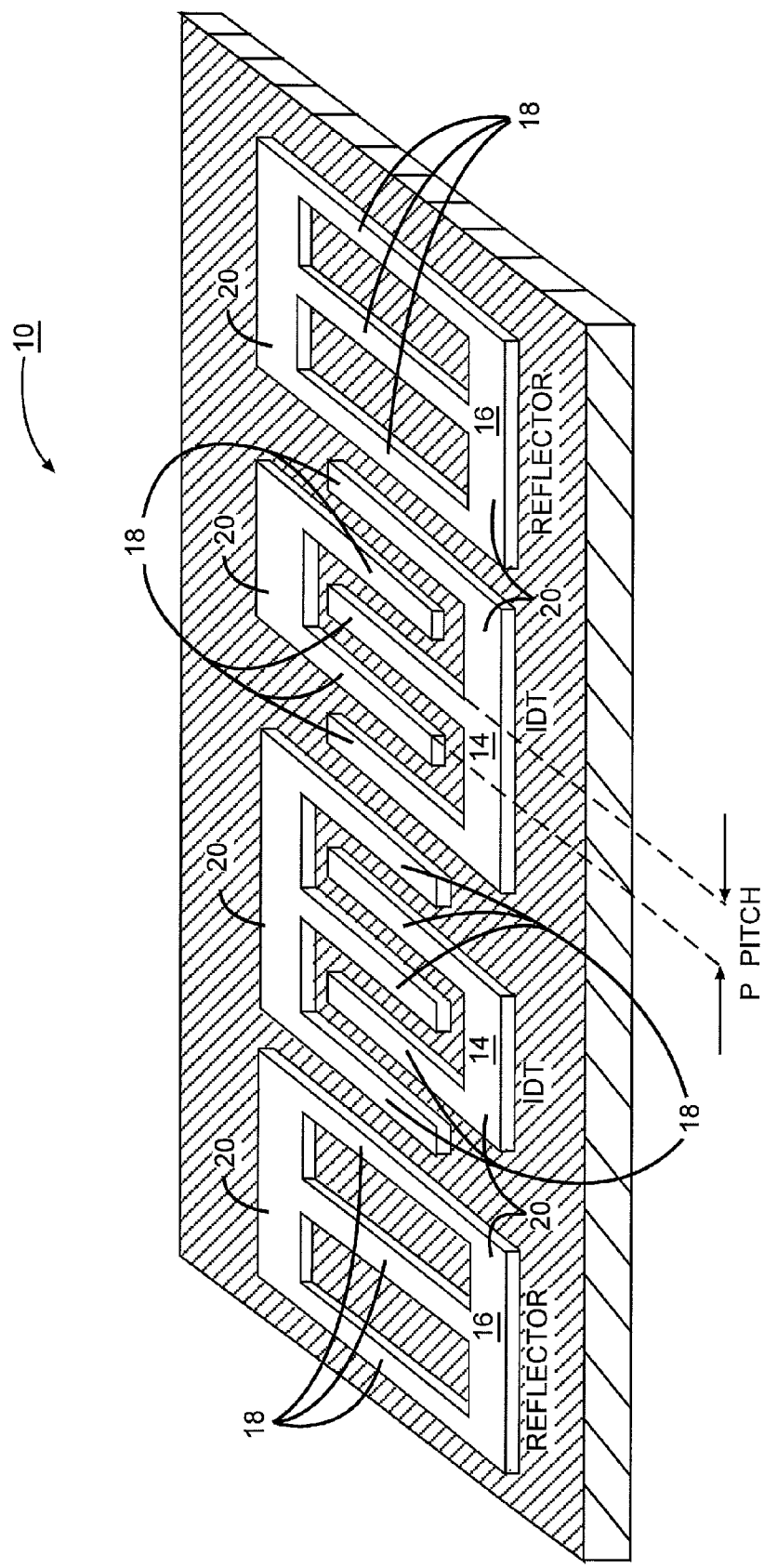
FIG. 1 illustrates a basic SAW architecture according to the prior art.

With reference to FIG. 1, a typical SAW architecture 10 is illustrated. The SAW architecture 10 will generally include a piezoelectric substrate 12, which has a surface on which various types of SAW elements may be formed. As illustrated, a dual-mode SAW (DMS) architecture is provided, wherein at least two inter-digital transducers (IDT) 14 are placed between two grating reflectors 16. Both the IDTs 14 and the reflectors 16 include a number of fingers 18 that are connected to opposing bus bars 20. For the reflectors 16, all of the fingers 18 connect to each bus bar 20. For the IDTs 14, alternating fingers 18 are connected to different bus bars 20, as depicted. Notably, the reflectors 16 and IDTs 14 generally have a much larger number of fingers 18 than depicted. The number of actual fingers 18 has been significantly reduced in the drawing figures in an effort to more clearly depict the overall concepts employed in available SAW architecture as well as the concepts provided by the present invention.

Notably, the fingers 18 are parallel to one another and aligned within an acoustic cavity, which essentially encompasses the area in which the reflectors 16 and the IDTs 14 reside. In this acoustic cavity, the standing wave or waves generated when the IDTs 14 are excited with electrical signals essentially reside within the acoustic cavity. As such, the acoustic wave energy essentially runs perpendicular across the various fingers 18. In the embodiment illustrated in FIG. 1, one IDT 14 may act as an input while the other IDT 14 may act as an output for electrical signals. Notably, the IDTs 14 and the reflectors 16 are oriented in acoustic series, such that the acoustic wave energy moves along the cavity and perpendicularly across the respective fingers 18 of the IDTs 14 and the reflectors 16.

Figure 2:
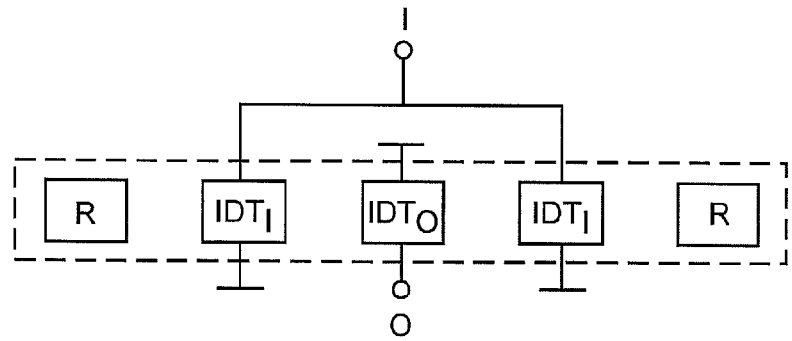
FIG. 2 is a block representation of a SAW filter architecture according to the prior art.

Depending on how the IDTs 14 are acoustically and electrically connected, SAW architectures 10 can provide electrical impedance transformations between input and output ports in addition to filtering electrical signals. With reference to FIG. 2, two input IDTs 14 (IDTI) and one output IDT 14 (IDTO) are aligned between two reflectors 16 (R) within an acoustic cavity represented by the area within the dashed line. The output IDT 14 (IDTO) is placed between the input IDTs 14 (IDTI). The input IDTs 14 (IDTI) are coupled to an input I and are electrically parallel to one another. An output port O is coupled to the output IDT 14 (IDTO). Notably, the input IDTs 14 and the output IDT 14 are oriented in acoustic series. In addition to being able to filter an input signal to provide a filtered output signal, the electrical input impedance is different than the electrical output impedance. Assuming each of the IDTs 14 (IDTI and IDTO) has substantially the same electrical impedance, the impedance transformation is represented as follows:

Eq. 1 Electrical input impedance=z/2, because the input IDTs ($IDT_I$) are in parallel.

Eq. 2 Electrical output impedance=z

Eq. 3 Ratio of electrical input impedance to output impedance=

$$\frac{z/2}{z} = \frac{1}{2}$$

Unfortunately, the SAW architectures 10 of the prior art are somewhat limited in their ability to provide wider bandwidths and lower insertion loss. The present invention provides techniques to provide wider bandwidths and lower insertion loss than SAW architecture 10.

Figure 3:
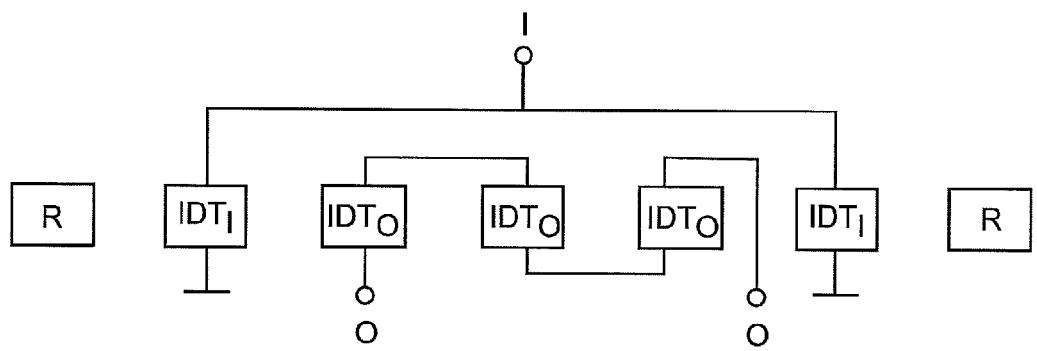
FIG. 3 is a block representation of a SAW filter architecture according a first embodiment of the present invention.

With reference to FIG. 3, one embodiment of the present invention provides for connecting three output IDTs 14 (IDTO) in electrical series within a DMS configuration. Again, the DMS configuration is one where input IDTs 14 (IDTI) and output IDTs 14 (IDTO) are between and in acoustic series with two reflectors 16 (R). In the embodiment illustrated in FIG. 3, the three output IDTs 14 (IDTO), which are connected in electrical series and acoustic series, are between and in acoustic series with two input IDTs 14 (IDTI). The impedance transformation for the SAW architecture 10 of FIG. 3 is as follows:

$$\frac{\text{Input electrical impedance}}{\text{Output electrical impedance}} = \frac{z/2}{3z} = \frac{1}{6} \qquad \text{Eq. 4}$$

$$\frac{\text{Input electrical impedance}}{\text{Output electrical impedance}} = \frac{z/2}{4z} = \frac{1}{8} \qquad \text{Eq. 5}$$

Figure 4A:
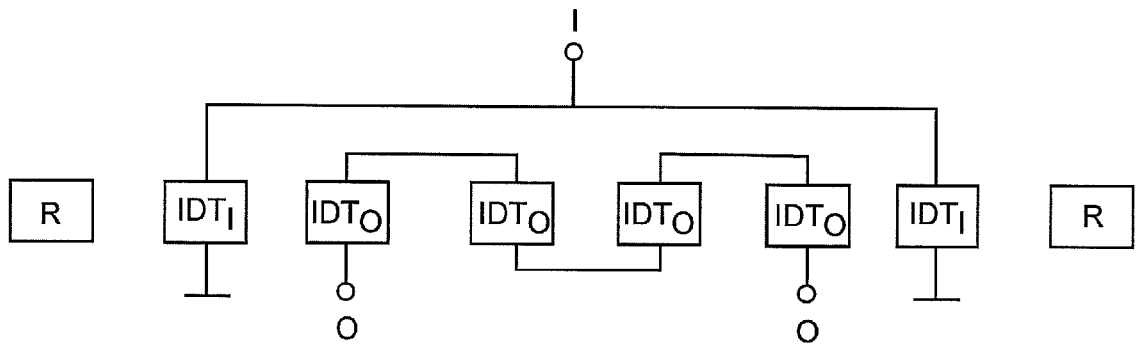
FIGS. 4A and 4B are block representations of SAW filter architectures according a second embodiment of the present invention.
Figure 4B:
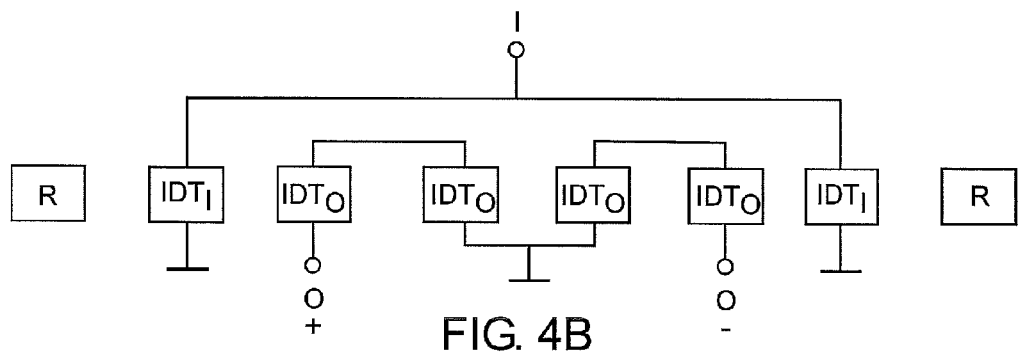
Figure 5A:
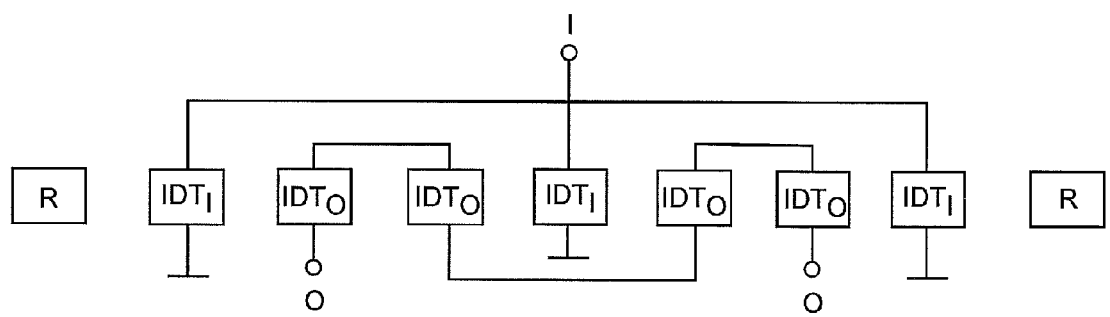
FIGS. 5A and 5B are block representations of SAW filter architectures according a third embodiment of the present invention.
Figure 5B:
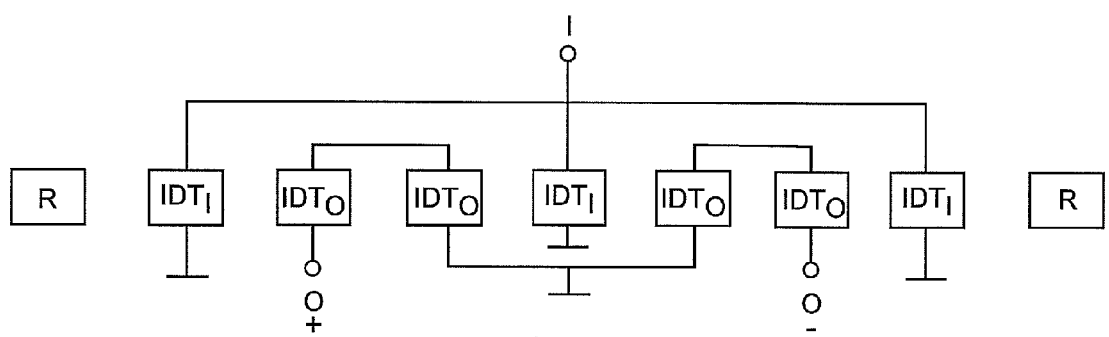
Figure 6A:
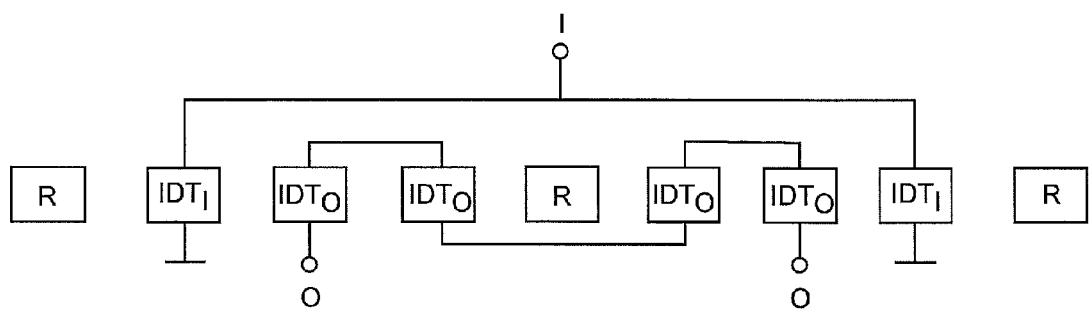
FIGS. 6A and 6B are block representations of SAW filter architectures according a fourth embodiment of the present invention
Figure 6B:
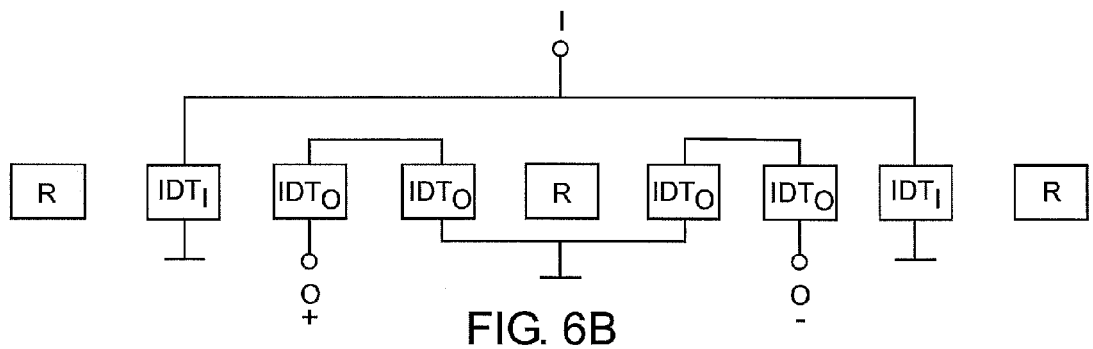

Turning now to FIG. 4A, any number of output IDTs 14 ($IDT_O$) can be connected in electrical and acoustic series with each other within the DMS architecture 10. In FIG. 4B, the center point between the central IDTs (IDTO) is grounded. This point is generally near zero potential in a differential output configuration. In short, three or more output IDTs 14 (IDTO) can be connected in electrical and acoustic series with each other within the DMS architecture 10. With reference to FIG. 5A, the output IDTs 14 (IDTO) that are connected in electrical and acoustic series need not be adjacent to one another. As depicted, there are three input IDTs 14 (IDTI). In FIG. 5B, the center point between the central IDTs (IDTO) is grounded. This point is generally near zero potential in a differential output configuration. Two of the input IDTs 14 (IDTI) are just inside the reflectors 16 (R), wherein the third input IDT 14 (IDTI) is between adjacent pairs of output IDTs 14 (IDTO). As illustrated in FIG. 6A, the three or more output IDTs 14 (IDTO) that are in electrical and acoustic series may be separated by a mid-cavity reflector 16 (R'). In FIG. 6B, the center point between the central IDTs (IDTO) is grounded. This point is generally near zero potential in a differential output configuration. To enhance the passband characteristics of SAW architectures 10, a technique referred to as "chirping" has been employed to manipulate the standing waves within the acoustic cavity. To date, chirping has only been employed on the outside edges of an IDT 14. Further, only the edges that are at the junction of an input IDT 14 (IDTI) and an output IDT 14 (IDTO) have been chirped. Chirping is the process of varying the pitch (P) in an IDT 14 within a chirping region. The sum of the width of a finger and the space between two adjacent fingers 18 of an IDT 14 or reflector 16 is generally referred to as a pitch. As such, chirping entails varying the pitch in a chirping region. In one embodiment, the length of chirping may range from one period to twelve periods where a period is the pitch of the non-chirped fingers.

Figure 7:
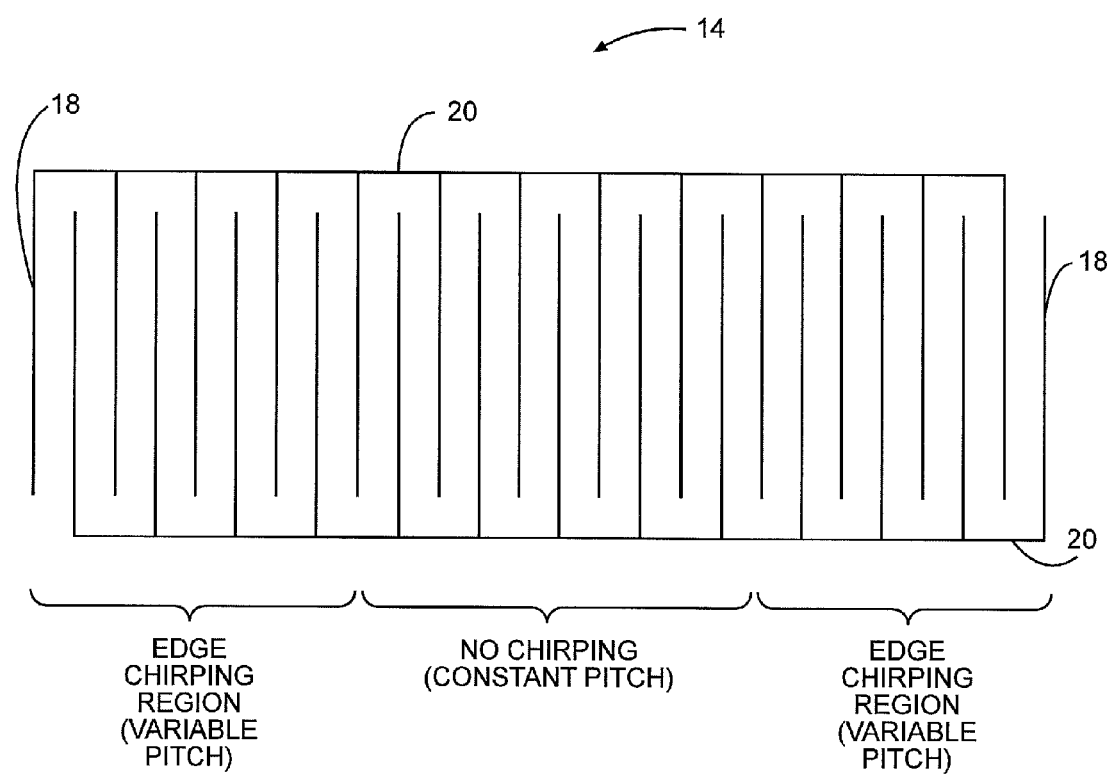
FIG. 7 illustrates edge chirping for a given IDT according to one embodiment of the present invention.

With reference to FIG. 7, there are edge chirping regions at the respective edges of the IDT 14 where the pitch varies throughout respective edge chirping regions. Between the edge chirping regions, there is no chirping and there is a constant pitch among the fingers 18. As such, the fingers 18 are equally spaced where there is no chirping. As will be described in further detail below, the present invention employs chirping in the interleaved IDT region Traditional edge chirping techniques between the adjacent edges of input IDTs 14 (IDTI) and output IDTs 14 (IDTO) may also be employed.

Figure 8:
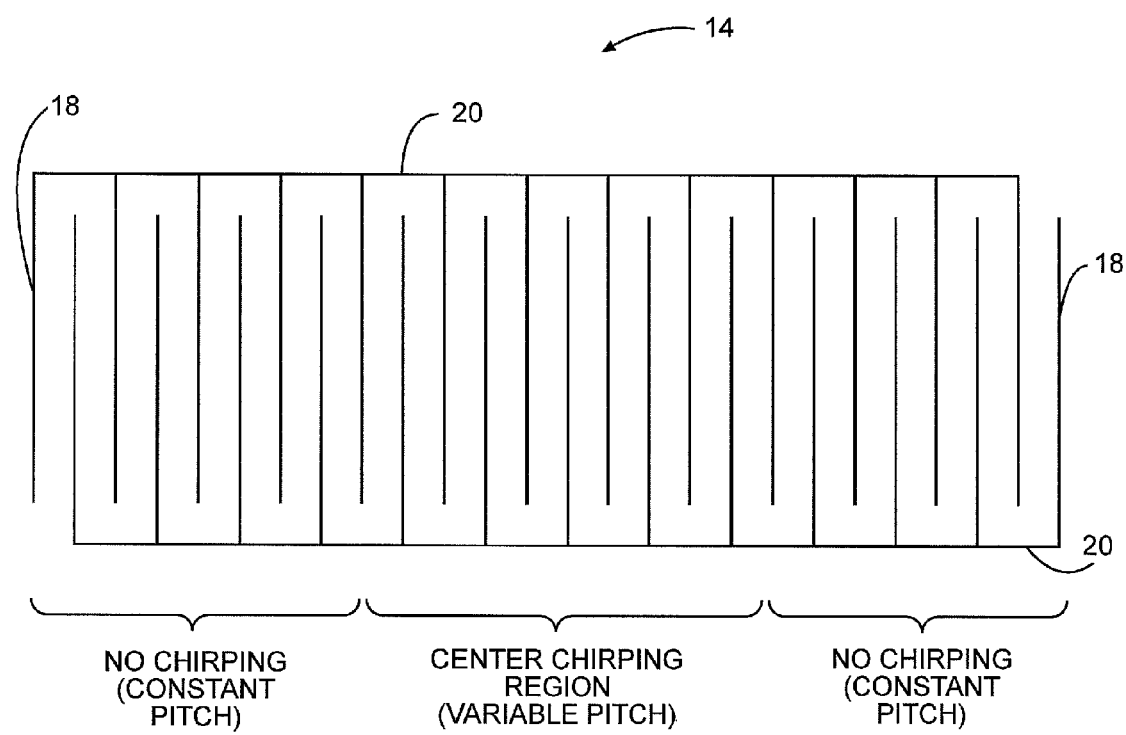
FIG. 8 illustrates center chirping for a given IDT according to one embodiment of the present invention.

With reference to FIG. 8, another embodiment of the present invention employs chirping in a central region of an IDT 14. In essence, throughout a center chirping region of the IDT 14, the pitch of the fingers 18 is varied. For the remaining portions of the IDT 14, there is no chirping. As such, there is a constant pitch among the fingers 18 in the other regions.

Figure 9:
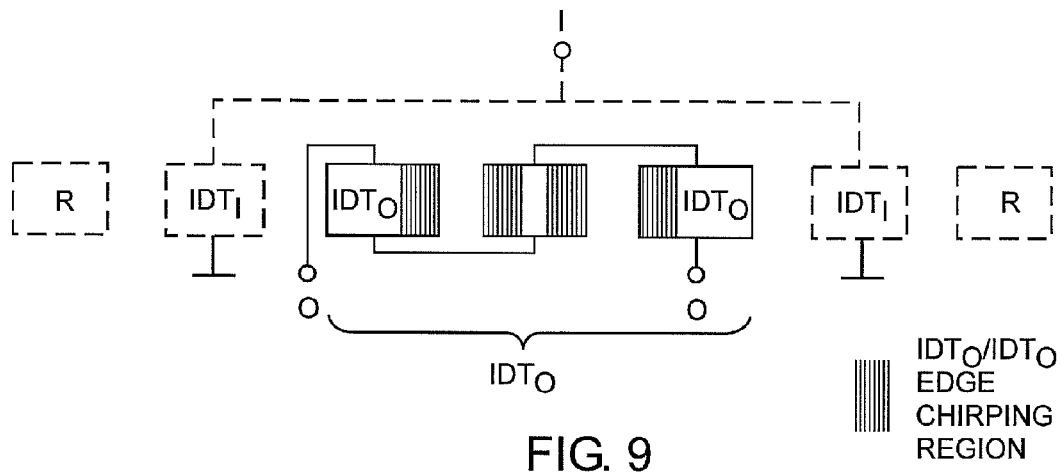
FIG. 9 is a block representation of a SAW filter architecture according to a fifth embodiment of the present invention.
Figure 10A:
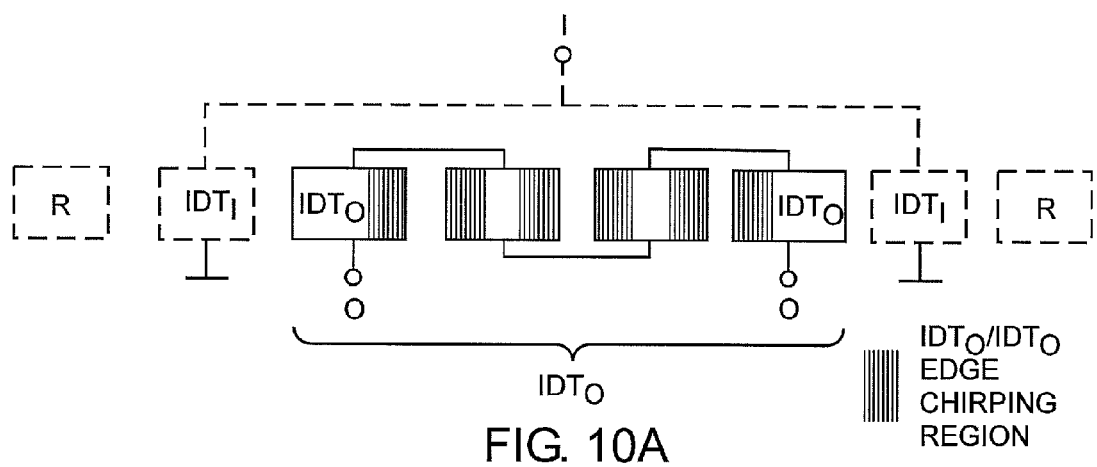
FIGS. 10A and 10B are block representations of SAW filter architectures according to a sixth embodiment of the present invention.
Figure 10B:
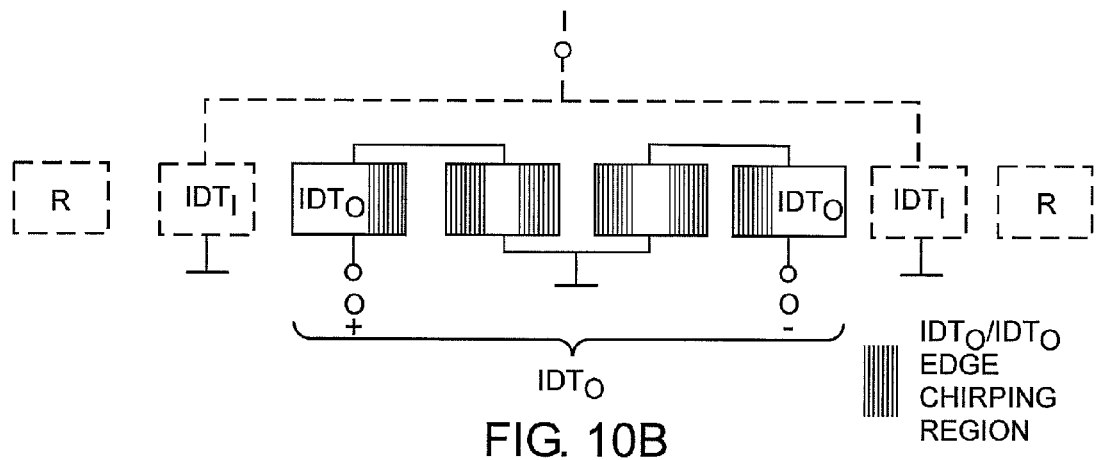

Applications of the novel chirping techniques of the present invention are now illustrated in FIGS. 9-14. With reference to FIG. 9, a DMS architecture 10 is illustrated where three output IDTs 14 (IDTO) are in electrical and acoustic series. Notably, at the edges of output IDTs 14 (IDTO) that are adjacent one another, edge chirping is employed. The output IDT to output IDT (IDTO/IDTO) edge chirping regions are shaded. Turning to FIG. 10A, there are four output IDTs 14 (IDTO) in electrical and acoustic series in a DMS architecture 10. Again, edge chirping is employed at the edges of the output IDTs 14 (IDTO) that are adjacent to other output IDTs 14 (IDTO). In FIG. 10B, the center point between the central IDTs (IDTO) is grounded. This point is generally near zero potential in a differential output configuration.

Figure 11:
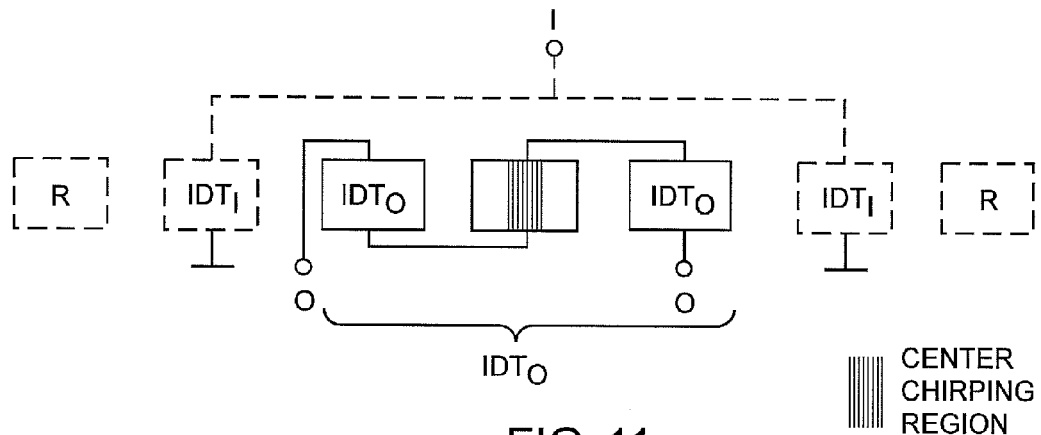
FIG. 11 is a block representation of a SAW filter architecture according to a seventh embodiment of the present invention.
Figure 12A:
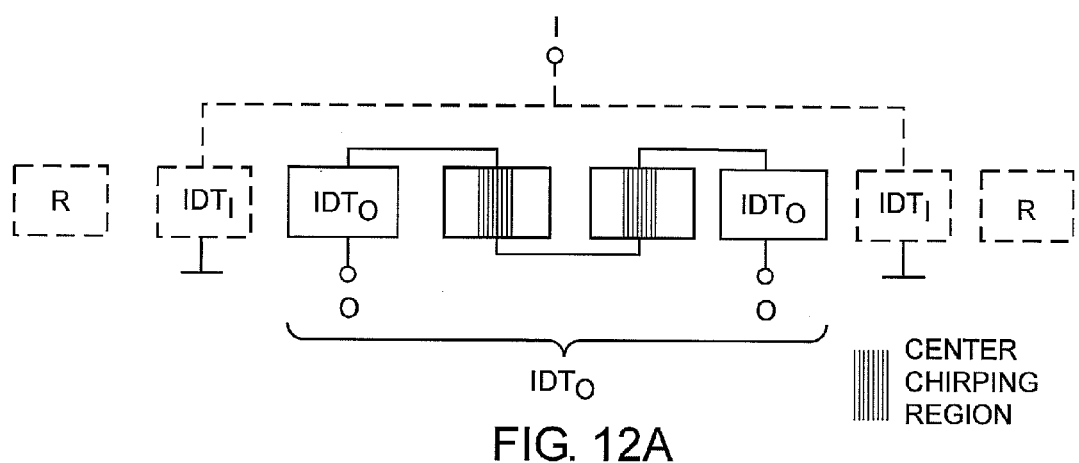
FIGS. 12A and 12B are block representations of SAW filter architectures according to a eighth embodiment of the present invention.
Figure 12B:
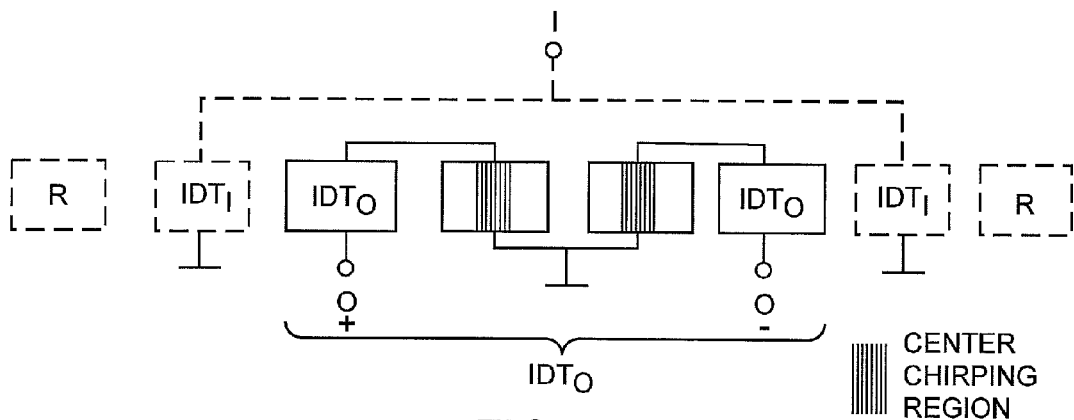

Turning now to FIG. 11, the central chirping technique is illustrated in a DMS architecture 10 where there are three output IDTs 14 (IDTO) in electrical and acoustic series. Notably, only the central output IDT 14 (IDTO) has a center chirping region. The outside output IDTs 14 (IDTO) do not employ center chirping and will not have a center chirping region. Regardless of the number of output IDTs 14 (IDTO) in electrical and acoustic series, only those output IDTs 14 (IDTO) that are located between two or more output IDTs 14 (IDTO) will employ center chirping. For example, the DMS architecture of FIG. 12A only employs center chirping in the center two output IDTs 14 (IDTO), and not in the two outside output IDTs 14 (IDTO). In FIG. 12B, the center point between the central IDTs (IDTO) is grounded. This point is generally near zero potential in a differential output configuration.

Figure 13:
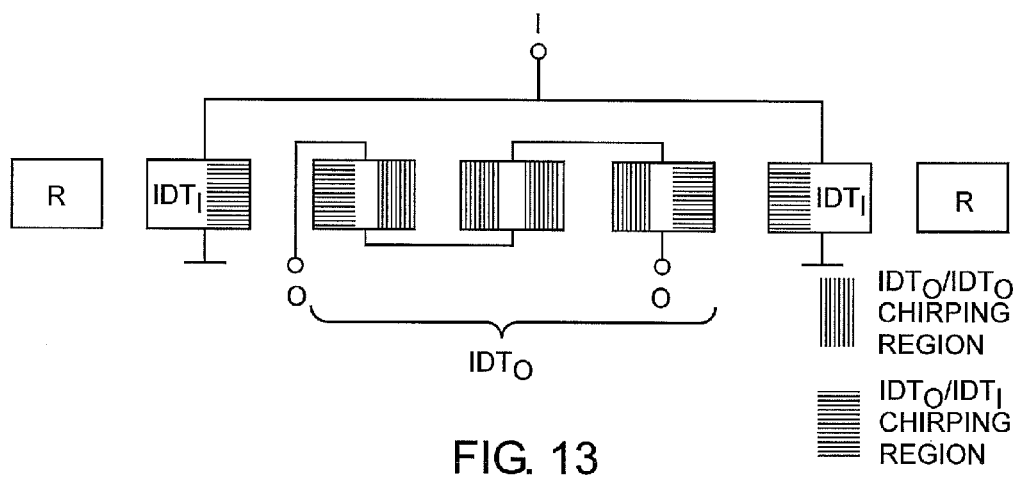
FIG. 13 is a block representation of a SAW filter architecture according to a ninth embodiment of the present invention.

As noted, the new chirping techniques provided by the present invention may be employed in combination with traditional chirping techniques, which have been reserved for the adjacent edges of input IDTs 14 (IDTI) and output IDTs 14 (IDTO). With reference to FIG. 13, the adjacent edges of adjacent output IDTs 14 (IDTO) are chirped in an IDTO/IDTO chirping region according to the present invention. The adjacent edges of adjacent output IDTs 14 (IDTO) and input IDTs 14 (IDTI) are chirped in an IDTO/IDTI chirping region.

Figure 14:
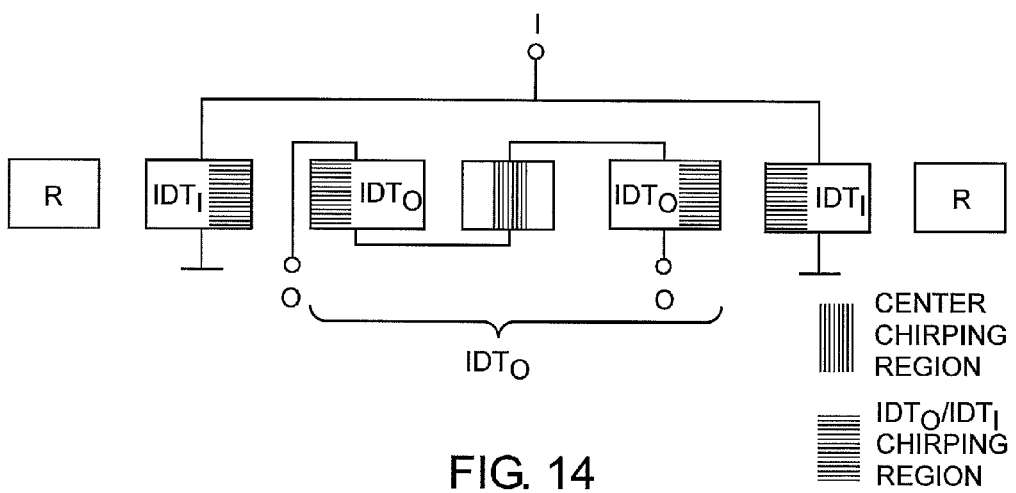
FIG. 14 is a block representation of a SAW filter architecture according to a tenth embodiment of the present invention.

With reference to FIG. 14, center chirping within a center region is only provided in the center output IDT 14 (IDTO), which is one of three output IDTs 14 (IDTO) in electrical and acoustic series. Notably, the outermost output IDTs 14 (IDTO) do not employ center chirping, as discussed above. However, traditional chirping techniques may be employed at adjacent edges of adjacent output IDTs 14 (IDTO) and input IDTs 14 (IDTI) in IDTO/IDTI chirping regions.

Figure 15:
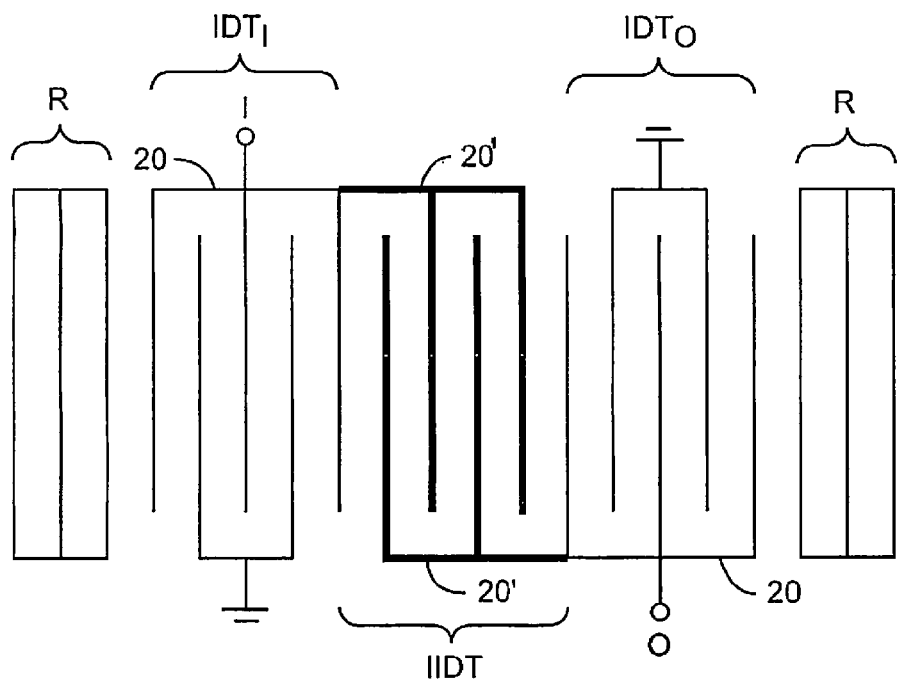
FIG. 15 is a graphical illustration of an interleaved IDT within a SAW filter architecture.

In yet another embodiment of the present invention, an interleaved IDT (IIDT) is connected to both an input IDT 14 (IDTI) and an output IDT 14 (IDTO) via corresponding bus bars 20. This technique is illustrated in FIG. 15, where the IIDT is highlighted in bold. In essence, a first bus bar 20' of the IIDT is connected to the bus bar 20 of the input IDT 14 (IDTI), and another bus bar 20' of the IIDT is connected to a bus bar 20 of the output IDT 14 (IDTO). Notably, the IIDT is coupled electrically to the respective input and output ports of the overall DMS architecture 10. Accordingly, the bus bars 20 of the respective input and output IDTs 14 are effectively extended such that the adjacent edges of the respective input and output IDTs 14 partially overlap one another in an interdigitated fashion.

Figure 16:
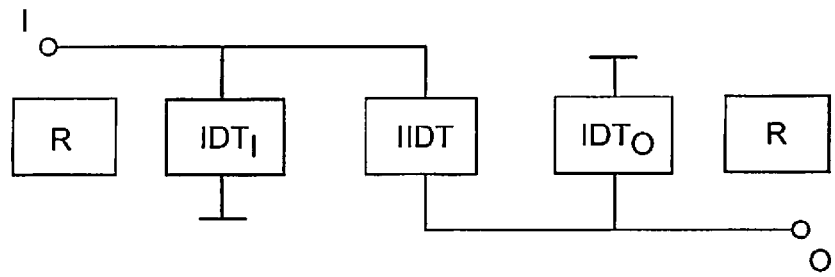
FIG. 16 is a block representation of a SAW filter architecture according to a eleventh embodiment of the present invention.
Figure 17:
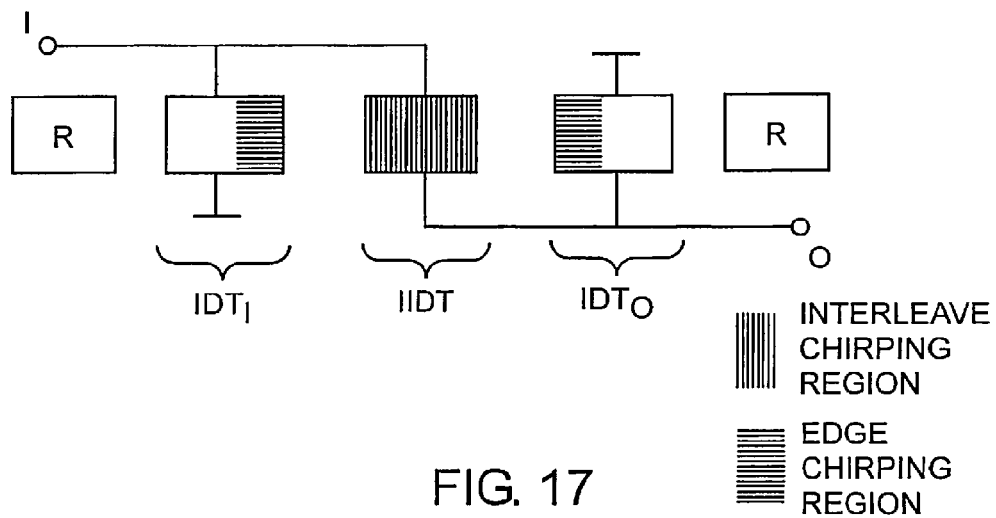
FIG. 17 is a block representation of a SAW filter architecture according to a twelfth embodiment of the present invention.

Chirping may be applied to the interleaved DMS architecture illustrated in FIG. 16. With reference to FIG. 17, the IIDT may employ chirping throughout its fingers 18, such that the pitch varies throughout the IIDT. Further, the edges of the input IDT 14 (IDTI) and the output IDT 14 (IDTO) are chirped throughout an edge chirping region, which is immediately adjacent the IIDT.

Figure 18:
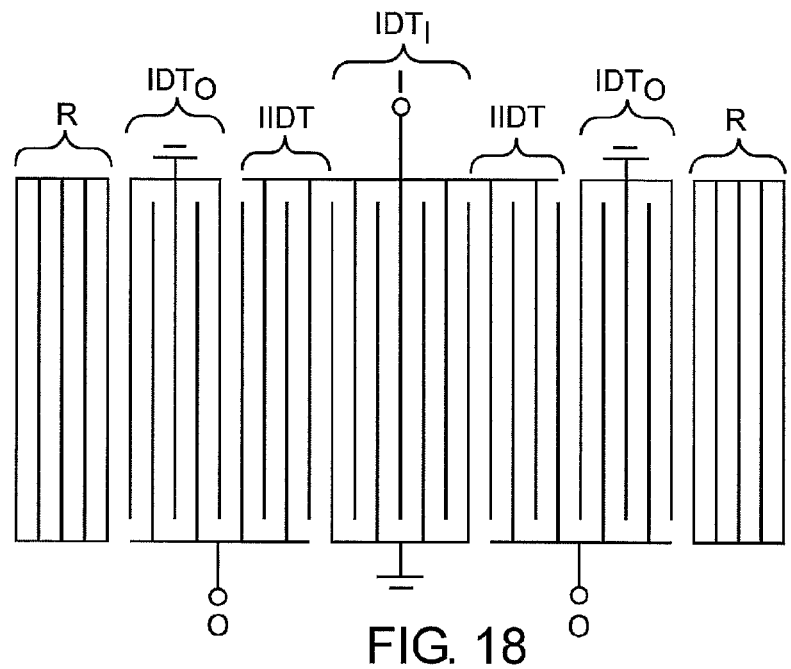
FIG. 18 is a block representation of multiple interleaved IDTs within a SAW filter architecture.
Figure 19:
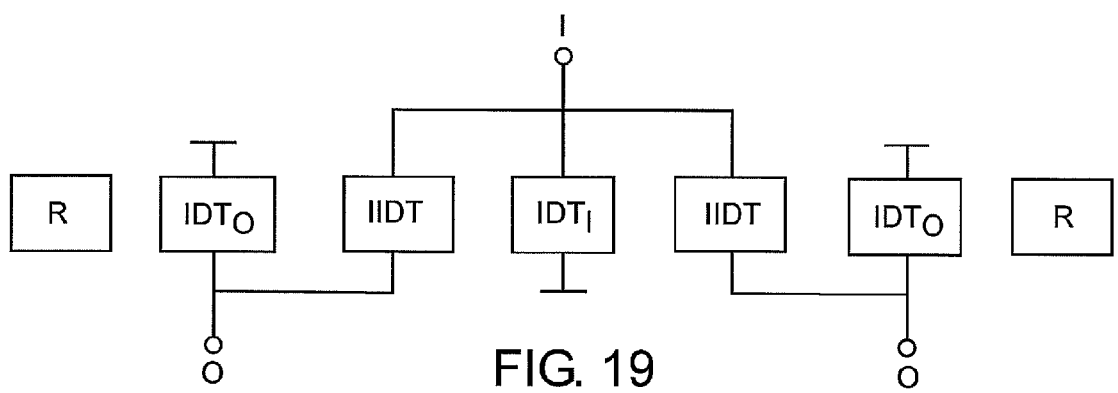
FIG. 19 is a block representation of a SAW filter architecture according to a thirteenth embodiment of the present invention.
Figure 20:
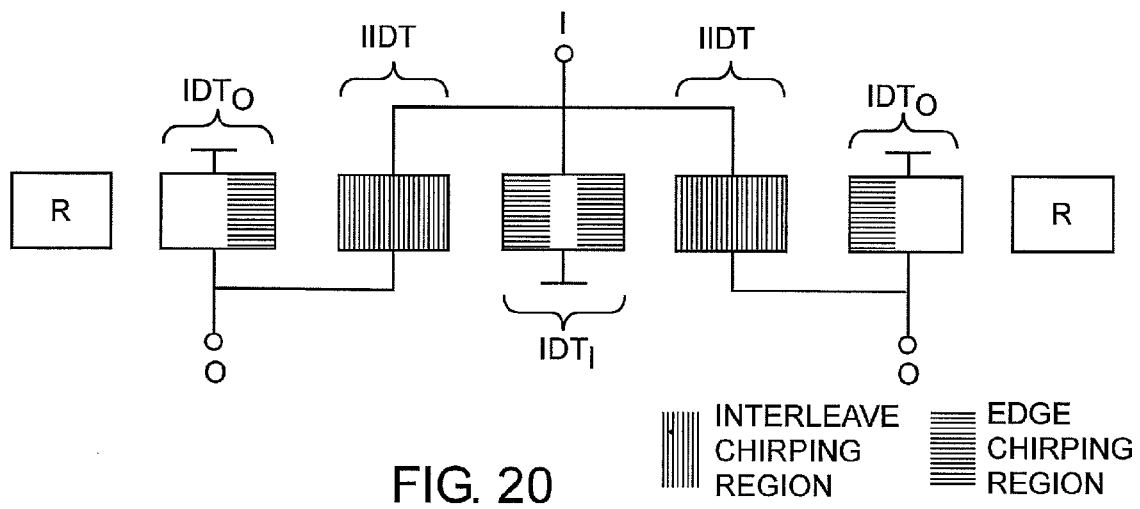
FIG. 20 is a block representation of a SAW filter architecture according to a fourteenth embodiment of the present invention.

With reference to FIG. 18, another example of an interleaved DMS architecture 10 is provided. A central input IDT 14 (IDTI) provides a single-ended input and two output IDTs 14 (IDTO) provide two outputs. IIDTs are provided between the input IDT 14 (IDTI) and the output IDTs 14 (IDTO) as described above. Reflectors 16 (R) frame the interleaved DMS architecture. FIG. 19 provides a block representation of the interleaved DMS architecture of FIG. 18. FIG. 20 illustrates how chirping may be employed in such an architecture. In particular, chirping is employed throughout the IIDTs and edge chirping is provided at the edges of either the input IDT 14 (IDTI) or the output IDTs 14 (IDTO) immediately adjacent to the IIDTs.

Figure 21A:
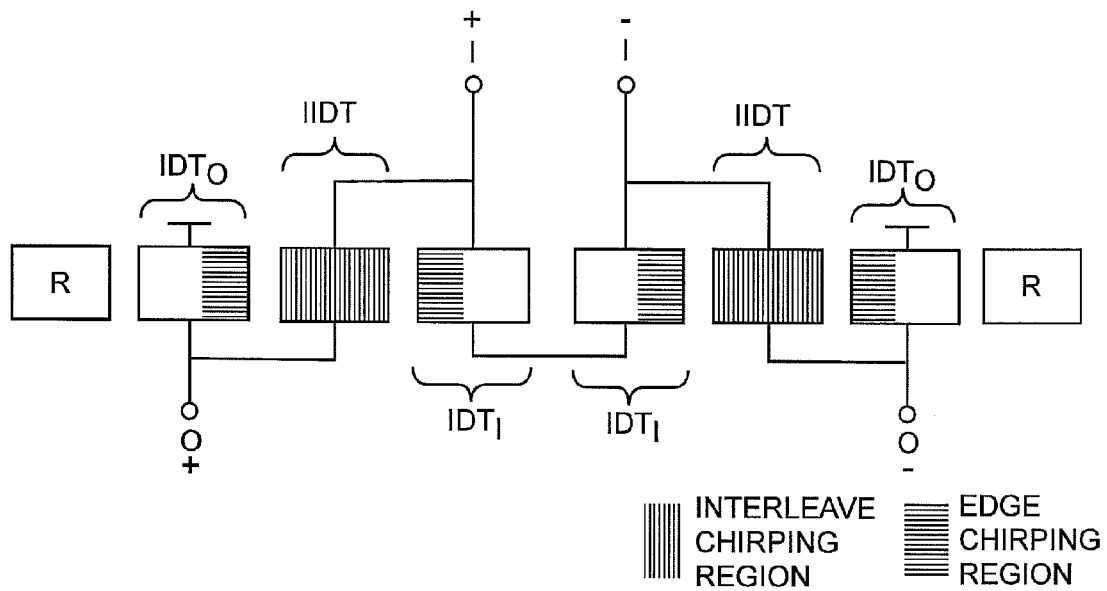
FIGS. 21A and 21B are block representations of SAW filter architectures according to a fifteenth embodiment of the present invention.
Figure 21B:
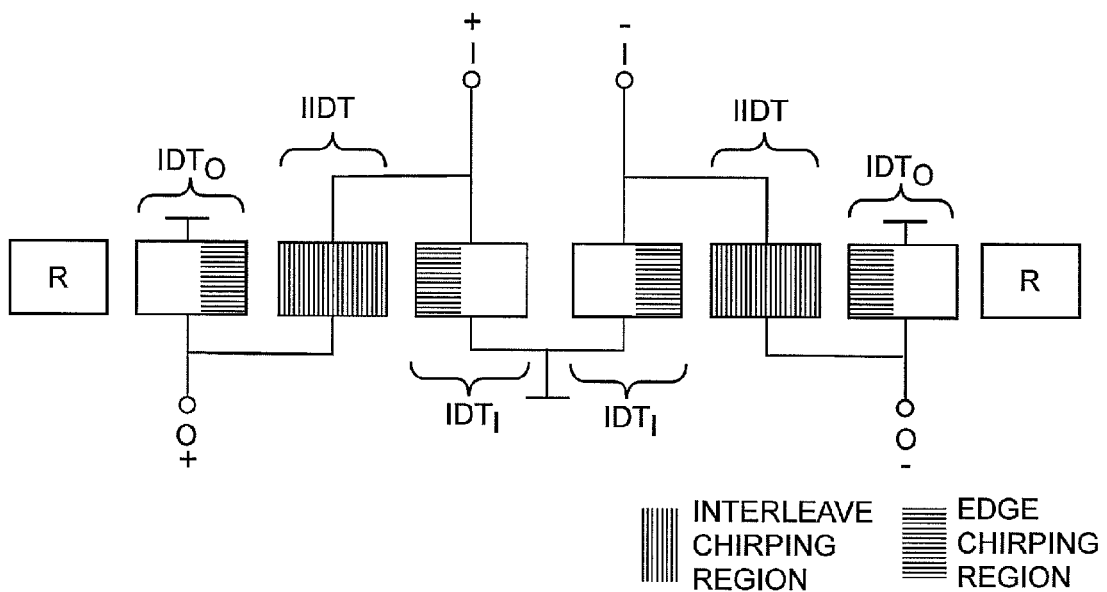

With reference to FIG. 21A, another example of an interleaved DMS architecture 10 is provided. The two inner input IDTs 14 (IDTI) provide a differential input and the two outer output IDTs 14 (IDTO) provide a differential output. In FIG. 21B, the center point between the central IDTs (IDTO) is grounded. This point is generally near zero potential in a differential output configuration.

Those skilled in the art will recognize that the SAW architectures discussed above are essentially reciprocal, such that the inputs in one application may serve as the outputs in another. As such, the nomenclature used to delineate input and output interfaces in the above embodiments are used merely for readability.

Those skilled in the art will recognize improvements and modifications to the preferred embodiments of the present invention. All such improvements and modifications are considered within the scope of the concepts disclosed herein and the claims that follow.

What is claimed is:
1. A method comprising:
providing a piezoelectric substrate;

forming two acoustic reflectors on the piezoelectric substrate to create an acoustic cavity between the acoustic reflectors;

forming an alpha IDT on the piezoelectric substrate between the acoustic reflectors, the alpha IDT comprising a first alpha bus bar electrically coupled to a first interface and a second alpha bus bar;

forming a beta IDT on the piezoelectric substrate between the acoustic reflectors, the beta IDT comprising a first beta bus bar and a second beta bus bar electrically coupled to a second interface; and forming an interleaved IDT on the piezoelectric substrate between the alpha IDT and the beta IDT, the interleaved IDT comprising a first interleaved bus bar electrically coupled to the first alpha bus bar of the alpha IDT and a second interleaved bus bar electrically coupled to the second beta bus bar of the beta IDT, each of the alpha IDT, the beta IDT, and the interleaved IDT aligned in acoustic series with each other within the acoustic cavity.

2. The method of claim 1 wherein at least a portion of the interleaved IDT is chirped.

3. The method of claim 1 wherein the entire interleaved IDT is chirped.

4. The method of claim 1 wherein the alpha IDT has a first alpha edge adjacent the interleaved IDT and the first alpha edge is chirped.

5. The method of claim 1 wherein the beta IDT has a first beta edge adjacent the interleaved IDT and the first beta edge is chirped.

6. The method of claim 1 wherein the interleaved IDT chirped; the alpha IDT has a first alpha edge adjacent the interleaved IDT and the first alpha edge is chirped; and the beta IDT has a first beta edge adjacent the interleaved IDT and the first beta edge is chirped.

7. The method of claim 1 further comprising:
forming a gamma IDT on the piezoelectric substrate between the alpha IDT and one of the acoustic reflectors, the gamma IDT comprising a first gamma bus bar and a second gamma bus bar electrically coupled to a third interface; and forming a second interleaved IDT on the piezoelectric substrate between the alpha IDT and the gamma IDT, the second interleaved IDT comprising a third interleaved bus bar electrically coupled to the first alpha bus bar of the alpha IDT and a fourth interleaved bus bar electrically coupled to the second gamma bus bar of the gamma IDT, each of the alpha IDT, the beta IDT, the gamma IDT, the interleaved IDT, and the second interleaved IDT aligned in acoustic series with each other within the acoustic cavity.

8. The method of claim 7 wherein the interleaved IDT and the second interleaved IDT are chirped; both edges of the alpha IDT are chirped; and edges of the beta IDT and gamma IDT adjacent the interleaved IDT or the second interleaved IDT are chirped.

9. The method of claim 1 wherein the first interface is associated with a first electrical impedance and the second interface is associated with a second electrical impedance, such that an electrical impedance transformation is provided between the first interface and the second interface.

10. The method of claim 1 wherein the alpha IDT and the beta IDT cooperate to provide a filter response between the first interface and the second interface.

\* \* \* \* \*